US008765531B2

(12) United States Patent
Gatterbauer et al.

(10) Patent No.: US 8,765,531 B2
(45) Date of Patent: Jul. 1, 2014

(54) METHOD FOR MANUFACTURING A METAL PAD STRUCTURE OF A DIE, A METHOD FOR MANUFACTURING A BOND PAD OF A CHIP, A DIE ARRANGEMENT AND A CHIP ARRANGEMENT

(75) Inventors: Johann Gatterbauer, Parsberg (DE); Bernhard Weidgans, Bernhardswald (DE); Joerg Busch, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 13/590,218

(22) Filed: Aug. 21, 2012

(65) Prior Publication Data

US 2014/0054800 A1    Feb. 27, 2014

(51) Int. Cl.
*H01L 21/00*    (2006.01)
*H01L 23/48*    (2006.01)
*H01L 23/00*    (2006.01)
*H01L 23/498*   (2006.01)

(52) U.S. Cl.
CPC ............... *H01L 24/05* (2013.01); *H01L 24/81* (2013.01); *H01L 23/498* (2013.01); *H01L 2224/02* (2013.01); *H01L 2224/0212* (2013.01); *H01L 2224/03019* (2013.01)
USPC ........... 438/127; 438/106; 438/121; 438/125; 438/124; 438/126; 257/786; 257/787; 257/788; 257/790; 257/734

(58) Field of Classification Search
CPC .............. H01L 23/498; H01L 2224/02; H01L 2224/0212; H01L 2224/02123; H01L 2224/02163; H01L 2224/03011; H01L 2224/03019; H01L 2224/033; H01L 24/81; H01L 24/94; H01L 24/97; H01L 24/03; H01L 24/05; H01L 24/48; H01L 24/85
USPC ......... 257/106, 127, 121, 125, 124, 126, 787, 257/788, 790, 734, 741, 750, 773, 774, 775, 257/784, 786; 438/787, 788, 790, 734, 741, 438/750, 773, 774, 775, 784, 786, 106, 127, 438/121, 125, 124, 126
See application file for complete search history.

(56) References Cited

U.S. PATENT DOCUMENTS

| | | | |
|---|---|---|---|
| 2011/0198751 A1* | 8/2011 | Mathew | 257/738 |
| 2011/0272819 A1* | 11/2011 | Park et al. | 257/774 |
| 2013/0234318 A1* | 9/2013 | Lee et al. | 257/737 |

OTHER PUBLICATIONS

ST Microelectronics, Analyst Field Trip 2011, 2011 Investors and Analyst Day, May 19, 2011—New York, pp. 1-31.

* cited by examiner

*Primary Examiner* — Chuong A Luu
*Assistant Examiner* — Cory Eskridge

(57) ABSTRACT

A method for manufacturing a metal pad structure of a die is provided, the method including: forming a metal pad between encapsulation material of the die, wherein the metal pad and the encapsulation material are separated from each other by a gap; and forming additional material in the gap to narrow at least a part of the gap.

23 Claims, 9 Drawing Sheets

--Prior Art--

--Prior Art--

--Prior Art--

| forming a metal pad between encapsulation material of the die, wherein the metal pad and the encapsulation material are separated from each other by a gap; and | ∼ 410 |

| forming additional material in the gap to narrow at least a part of the gap. | ∼ 420 |

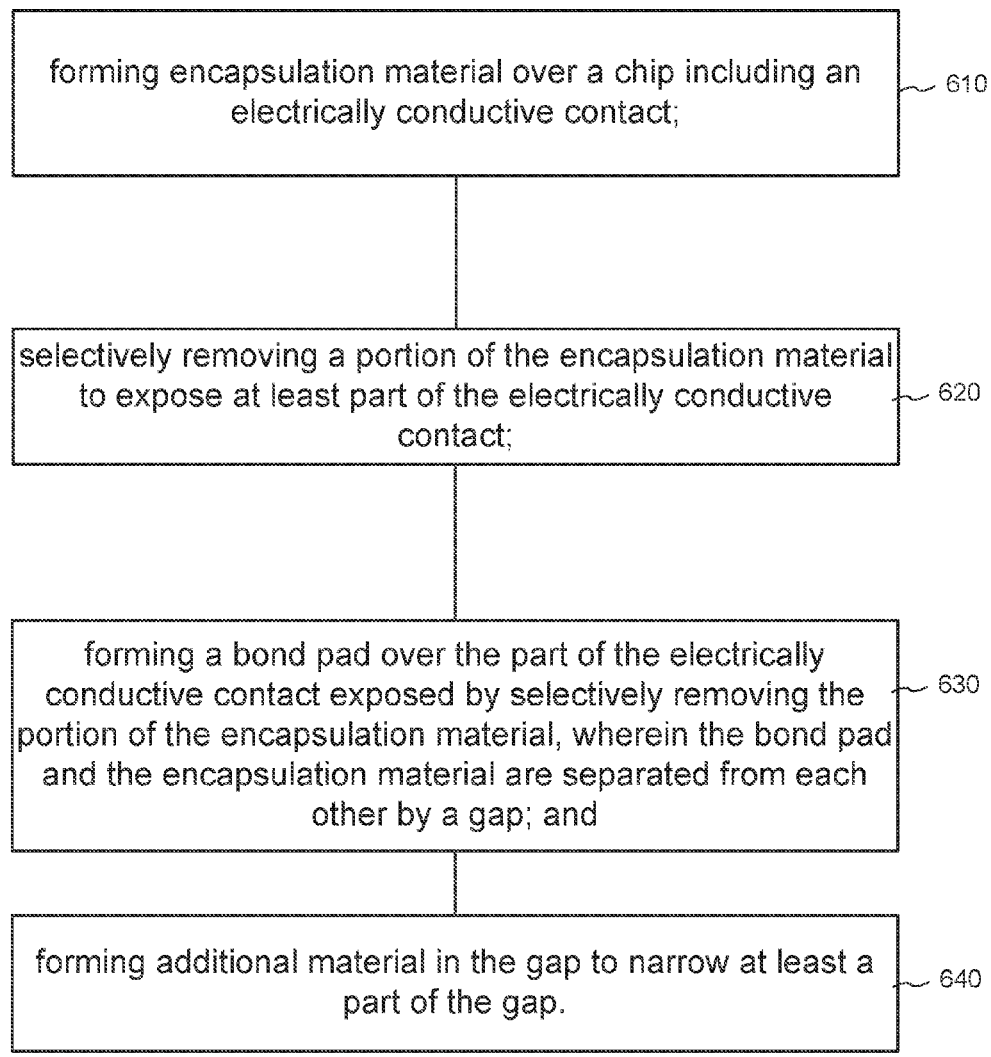

METHOD FOR MANUFACTURING A METAL PAD STRUCTURE OF A DIE, A METHOD FOR MANUFACTURING A BOND PAD OF A CHIP, A DIE ARRANGEMENT AND A CHIP ARRANGEMENT

TECHNICAL FIELD

Various embodiments relate generally to a method for manufacturing a metal pad structure of a die, a method for manufacturing a bond pad of a chip, a die arrangement and a chip arrangement.

BACKGROUND

Gold (Au) bonding on aluminum (Al) pads have traditionally been used as interconnects. Aluminum pad metallizations have good self-passivation properties. However, with respect to high temperature requirements, e.g. temperatures larger than 150° C., the interfaces to gold may be limited, e.g. in terms of reliability, due to reasons such as metallic phase formation and Kirkendall voiding. There are two main approaches pursued by the semiconductor industry to overcome these reliability limitations and to avoid the costly alternative of implementing an Au pad metallization.

First, copper (Cu) wire may be applied on Al pads thereby possibly increasing life time significantly if the mechanical impact of a wire bond process is under control.

Second, pad enforcement over pad metallization (OPM) may be carried out, e.g. by electroless deposition, for example of Nickel-Phosphorus (NiP) or Palladium (Pd) or Gold (Au).

As shown in FIG. 1, an OPM 102, e.g. a palladium OPM, may be applied, e.g. over a metal pad 104, e.g. an Al pad. OPM 102 may form a reliable interface for Au wire bonding but may also be used for aluminum or copper interconnects. An optional Au-flash as pad finish may increase pad robustness against oxidation. A benefit of electroless plating for OPM is metal growth may be carried out only on the pad metallization 104, e.g. on the redistribution layer (RDL). As there may be no reaction with isolating materials 106 such as polyimide or passivation layers, consequently, there may be no adhesion of OPM to sidewalls 108. After plating, e.g. electroless plating, there may be an infinitely small gap 112 along these sidewalls which might be acceptable. However, when heat treatment is applied, e.g. during data retention bake, the amorphous deposited NiP layer may crystallize at approximately 350° C. and may cause a shrink of the NiP layer, i.e. the OPM layer, and/or a change in the shape of the imide, which may enlarge the gap at sidewalls. The enlarged broader gap 112 opens a pathway for subsequent process steps, e.g. Au-flash, which may contact the interface of the metal pad, e.g. the Al pad and NiP layer. Subsequently these interfaces may be attacked as the gap between the OPM and imide/passivation may enable corrosive attack. Furthermore, for open cavity packages, e.g. packaging processes for an isolated chip, a chip may be covered by a gel, e.g. an encapsulation material, and a gap may result in corrosion under hazardous environments. Alternative OPM arrangements are shown in FIG. 2 and FIG. 3.

SUMMARY

Various embodiments provide a method for manufacturing a metal pad structure of a die, the method including: forming a metal pad between encapsulation material of the die, wherein the metal pad and the encapsulation material are separated from each other by a gap; and forming additional material in the gap to narrow at least a part of the gap.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a method for manufacturing a bond pad of a chip according to an embodiment.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a method for closing a gap, e.g. a gap formed between a metal pad structure and isolation. The method according to various embodiments may avoid additional lithography layers and/or steps.

Figure 1:
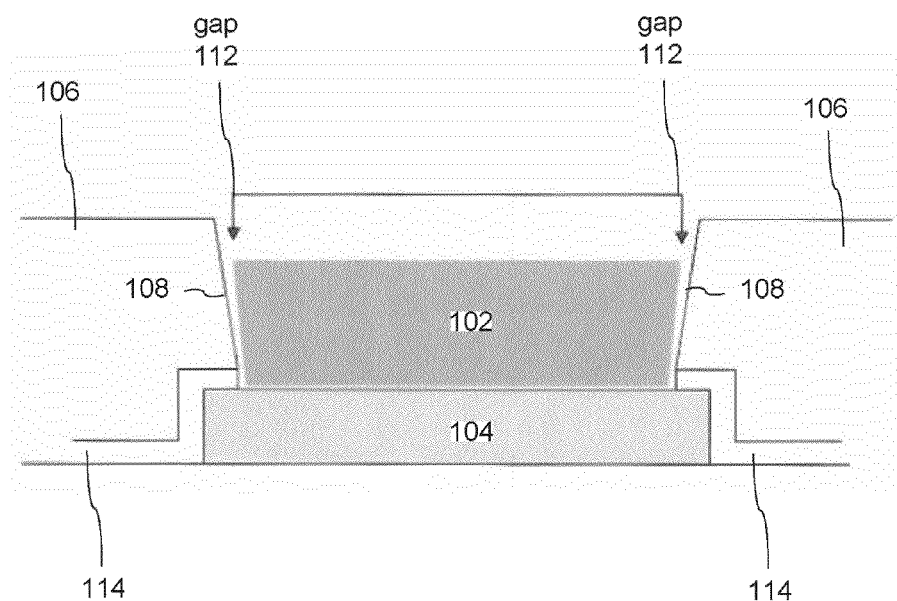
FIG. 1 shows a metal pad of a chip manufactured using a ratio imide process.
Figure 2:
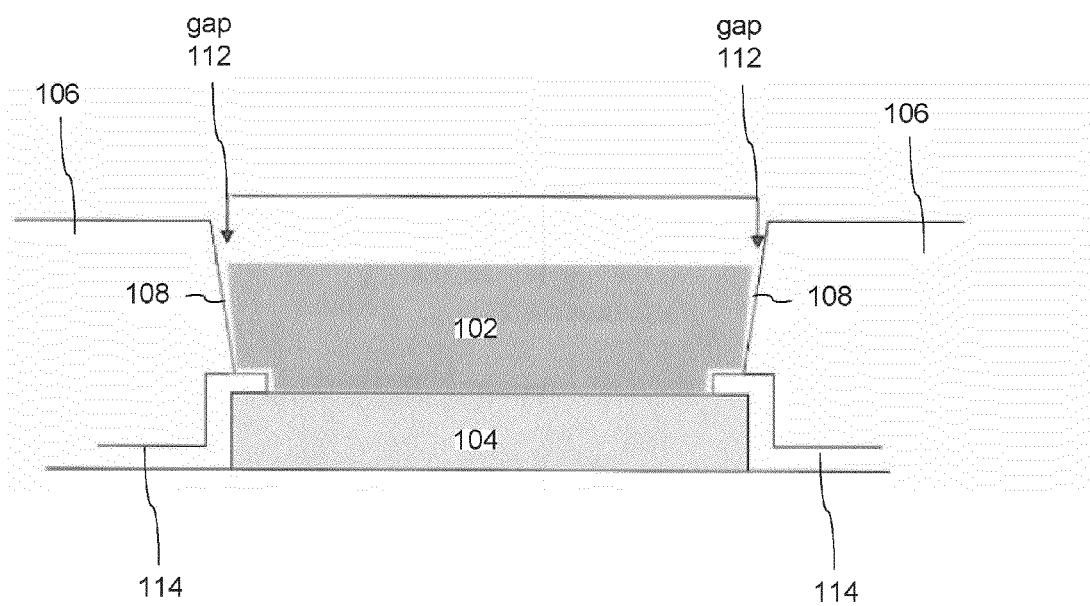
FIG. 2 shows a metal pad of a chip manufactured using a non-ratio imide process.
Figure 3:
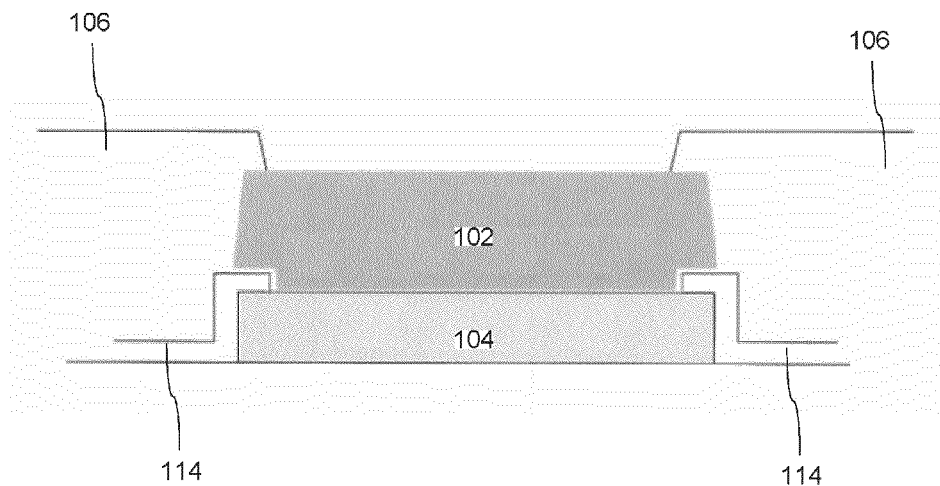
FIG. 3 shows a metal pad of a chip manufactured using a ProCoat process.
Figure 4:
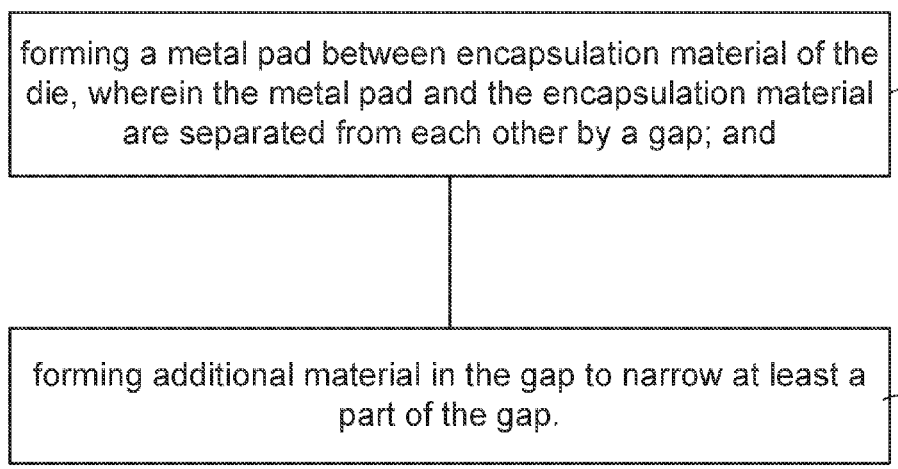
FIG. 4 shows a method for manufacturing a metal pad structure of a die according to an embodiment.

FIG. 4 shows method 400 for manufacturing a metal pad structure of a die. Method 400 may include:

forming a metal pad between encapsulation material of the die, wherein the metal pad and the encapsulation material are separated from each other by a gap (in 410); and forming additional material in the gap to narrow at least a part of the gap (in 420).

FIG. 5 shows method 500 for manufacturing a metal pad structure of a die.

In process 510 of method 500, passivation material 514 may be deposited over a die 516 including electrically conductive contact 504. Die 516 may include a semiconductor chip, e.g. a semiconductor chip including an integrated circuit, e.g. including one or more sensors, e.g. one or more controllers, e.g. one or more transistors. Die 516 may include a semiconductor chip, which may include one or more electronic components formed over and/or within at least part of a wafer substrate. The wafer substrate may include various materials, e.g. a semiconductor material. The wafer substrate may include at least one from the following group of materials, the group of materials consisting of: Silicon, Germanium, Group III to V materials, polymers, doped or undoped silicon, a silicon on insulator (SOI) wafer, a semiconductor compound material, e.g. gallium arsenide (GaAs), e.g. indium phosphide (InP), a quaternary semiconductor compound material, e.g. indium gallium arsenide (InGaAs).

Electrically conductive contact 504 may be referred to as an electrically conductive contact pad, and may be formed, for example over a front side 524 or back side (not shown) of die 516. Front side 524 may be understood to refer to a side of the chip which may typically carry one or more contact pads, or electrical contacts, wherein bonding pads or electrical connects may be attached; or wherein it is the side of the chip which may be mostly covered by metallization layers, for example with respect to logic devices. Electrically conductive contact 504 may be electrically connected to one or more electrical circuits and/or components formed within die 516, and may serve to provide an external connection pad (for example on die front side or back side) for providing electrical power to electrically activate the electrically circuits. For example, electrically conductive contact 504 may be electrically connected to another die and/or a circuit board by means of wired connections, e.g. bond wires, electrically connected and/or adhered to electrically conductive contact 504. Electrically conductive contact 504 may include at least one material, element or alloy from the following group of materials, the group consisting of: copper, aluminum, silver, tin, gold, palladium, zinc, nickel, iron. Electrically conductive contact 504 may include at least part of an electrically conductive redistribution layer of the die. Electrically conductive contact 504 may include an electrically conductive redistribution layer of the die.

Passivation material 514 may include at least one material from the following group of materials, the group consisting of: silicon oxide (SiO), silicon dioxide (SiO2), silicon nitride (Si3N4), silicon carbide (SiC). Passivation material 514 may be deposited by at least one method from the following group of deposition methods, the group consisting of: vapor phase deposition, evaporation, sputtering, chemical vapor deposition. Passivation material 514 may have a thickness ranging from about 40 nm to about 1000 nm, e.g. from about 50 nm to about 800 nm, e.g. from about 100 nm to about 500 nm. Passivation material 514 may be formed over a top side of electrically conductive contact 504 and over one or more sidewalls of electrically conductive contact. In other words, passivation material 514 may substantially cover electrically conductive contact.

In process 520 of method 500, encapsulation material 506 may be deposited over passivation material 514. Encapsulation material 506 may include at least one material from the following group of materials, the group consisting of: polyimide, epoxy, polymers, silicon dioxide, silicon nitride. Encapsulation material 506 may be chosen (for example, the original polyimide) such that it may provide a suitable chip surface and/or a suitable chip package surface to fulfill package related requirements, e.g. good adhesion to mold compound. Encapsulation material 506 may have a thickness ranging from about 5 µm to about 15 µm.

In process 530 of method 500, portion 518 of passivation material 514 and encapsulation material 506 may be selectively removed such that a part 522 of electrically conductive contact 504 may be freed from passivation material 514 and encapsulation material 506. In other words, an opening may be formed in encapsulation material 506 and passivation material 514, wherein the opening exposes at least a part of electrically conductive contact 504.

In case passivation material 514 is not deposited over die 516, encapsulation material 506 may be deposited over, e.g. directly on electrically conductive contact 504 of die 516 and at least a part of electrically conductive contact 504 may be exposed and/or freed from encapsulation material 506 by forming an opening in encapsulation material 506. In other words, encapsulation material 506 may be deposited over an electrically conductive portion of die 516, e.g. an electrically conductive redistribution layer; and at least a part 522 of electrically conductive contact 504 may be exposed and/or freed from encapsulation material 506 by forming an opening in encapsulation material 506 . A part 522 of electrically conductive contact 504 may be free from the encapsulation material 506 and/or passivation material 514, and a further part 523 of electrically conductive contact 504 may be covered by encapsulation material 506 and/or passivation material 514. Part 522 of electrically conductive contact 504 may have a length ranging from about 2 µm to about 1000 µm.

Encapsulation material 506 may be removed by lithography and development process respectively.

Passivation material 514 may be selectively etched in a single process using chemical etching and/or plasma etching either by separate lithography or by using structure of encapsulation material 506. According to other embodiments, passivation material 506 may be selectively removed using reactive chemistries, e.g. fluorine or chlorine.

In process 540 of method 500, metal pad 502 may be formed over part 522 (an electrically conductive portion) of electrically conductive contact 504 which may be free from passivation material 514 and encapsulation material 506. In other words, metal pad 502 may be formed over the part 522 which may have been exposed due to the selective removal of passivation material 514 and encapsulation material 506. The selective removal of passivation material 514 and encapsulation material 506 may have been carried out by forming an opening in and/or through passivation material 514 and encapsulation material 506. Metal pad 502 may have a thickness ranging from about 200 nm to about 20 µm, e.g. from about 500 nm to about 10 µm, e.g. from about 1 µm to about 5 µm. Metal pad 502 may include an over pad metallization (OPM) layer.

Metal pad 502 may be formed over part 522 of electrically conductive contact 504 between encapsulation material 506. Metal pad 502 may be formed between encapsulation material 506 of die 516, wherein metal pad 502 and encapsulation material 506 may be separated from each other by gap 512. Gap 512 may include one or more gaps 512, which are spaces between metal pad 502 and encapsulation material 506. Forming metal pad 502 between encapsulation material 506 of die 516 may include depositing metal pad 502 between encapsulation material 506 of die 516 by at least one deposition method from the following group of deposition methods, the group consisting of: electroless plating, electroplating, galvanic deposition, sputtering, evaporation. For example, encapsulation material 506 may serve as a mask for metal pad 502 (OPM), e.g. a plating mask for the OPM 502. In other words, metal pad 502 may be formed in accordance with the contours of sidewalls 508 of encapsulation material. However, metal pad 502 may not be plated on sidewalls 508.

Metal pad 502 and encapsulation material 506 may be separated from each other by gap 512, e.g. a space, ranging from about 10 nm to about 500 nm, e.g. about 15 nm to about 400 nm, e.g. about 20 nm to about 300 nm.

Method 500 may therefore include depositing encapsulation material 506 over die 516 including electrically conductive contact 504; selectively removing a portion of encapsulation material 506 to expose part 522 of electrically conductive contact 504; and forming metal pad 502 over part 522 of electrically conductive contact 504.

In process 550 of method 500, additional material 526 may be formed in gap 512 to narrow at least a part of gap 512. Forming additional material 526 in gap 512 to narrow at least a part of gap 512 may include forming an electrically conductive material in gap 512. Additional material 526 may include at least one electrically conductive material from the group of electrically conductive materials, the group of electrically conductive materials consisting of: palladium, silver, platinum, gold. Additional material 526 may include a noble metal. According to other embodiments, forming additional material 526 in gap 512 to narrow at least a part of gap 512 may include forming an electrically insulating material in the gap. Additional material 526 may include at least one electrically insulating material from the group of electrically insulating materials, the group of electrically insulating materials consisting of: epoxy, organic polymer, inorganic polymer, polyimide, a carbon-based material. Additional material 526 may be selected in consideration of the coefficient of thermal expansion (CTE) with respect to encapsulation material 506 and metal pad 502. Additional material 526 may include a thin isolating layer, e.g. electrically isolation and/or thermally conductive layer, which may adhere to both encapsulation material 506, e.g. polyimide (imide) and metal pad 502. Therefore, gap 512 may be narrowed or closed. In other words, additional material 526 may form a plug or stopper within gap 512 such that electrically conductive contact 504 may be shielded from external attack, e.g. from corrosive chemicals.

Forming additional material 526 in gap 512 may include forming additional material 526 in gap 512 by at least one deposition method from the following group of deposition methods, the group consisting of: spraying, vapor phase deposition, spin coating, dip coating, chemical vapor deposition, plasma enhanced chemical vapor deposition, atomic layer deposition, electroless plating, electroplating. Additional material 526 may include a liquid or a vapor. Additional material 526 may be formed in gap 512 due to a capillary effect which draws additional material 526 into gap 512. Forming additional material 526 in gap 512 to narrow at least a part of gap 512 may include at least partially filling the gap with additional material 526. Forming additional material 526 in gap 512 to narrow at least a part of gap 512 may include adhering additional material 526 to one or more sidewalls 508 of encapsulation material 506 and/or to one or more sidewalls 507 of metal pad 502. Forming additional material 526 in gap 512 to narrow at least a part of gap 512 may include adhering additional material 526 to part of sidewalls 508 of encapsulation material 506 and/or to part of sidewalls 507 of metal pad 502. Furthermore, forming additional material 526 in gap 512 to narrow at least a part of gap 512 may include forming additional material 526 over at least a portion of part 522 of electrically conductive contact 504. Furthermore, additional material 526 may be formed over metal pad 502, e.g. over a surface 528 of metal pad 502, and/or over encapsulation material sides, e.g. encapsulation material top sides 532 and over metal pad 502. Additional material 526 maybe subjected to a finalization process, e.g. heating and/or baking and/or annealing, which may optionally solidify additional material 526 and/or adhere additional material 526 within gap 512.

In process 560 of method 500, one or more portions of additional material 526 may be removed. For example, portions of additional material 526 formed over surface 528 of metal pad 502 may be removed. For example, portions of additional material 526 formed over encapsulation material side, e.g. encapsulation material top side 532 may be removed. In other words, only additional material 526 formed in gap 512 may remain. For example additional material 526 over sidewalls 508 of encapsulation material 506 and/or between sidewalls 508 and metal pad 502 and/or over sidewalls 507 of metal pad 502 and/or over electrically conductive contact 504, may remain. One or more portions of additional material 526 may be removed, for example by an etching process. Furthermore, a subsequent etch process may be carried out to clean the pads, e.g. top side 528 of metal pad 502 to ensure good bondability, e.g. good bonding of wires to metal pad 502.

According to various other embodiments, metal pad 502 may include a bond pad of a chip. Various embodiments provide method 600 for manufacturing bond pad 502 of chip 516. In connection with FIGS. 5A to 5F, method 600 may include: forming encapsulation material 506 over chip 516 including electrically conductive contact 504 (in 610); selectively removing a portion of encapsulation material 506 to expose at least part 522 of electrically conductive contact 504 (in 620); forming bond pad 502 over part 522 of electrically conductive contact 504 exposed by selective removing the portion of encapsulation material 506, wherein bond pad 502 and encapsulation material 506 may be separated from each other by gap 512 (in 630); and forming additional material 526 in gap 512 to narrow at least a part of gap 512 (in 640).

Figure 5A:
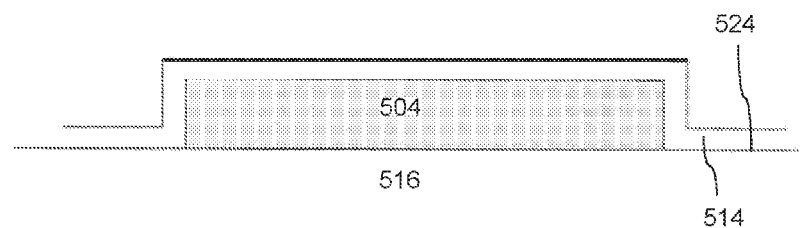
FIGS. 5A to 5F show a method for manufacturing a metal pad structure of a die according to an embodiment.
Figure 5B:
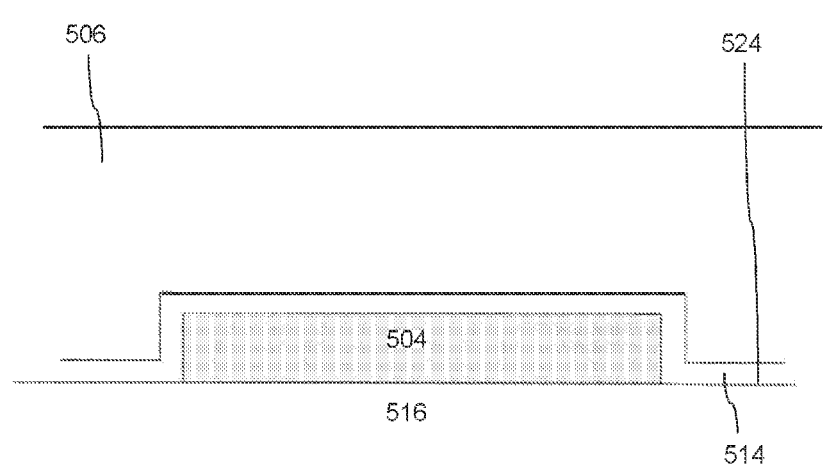
Figure 5C:
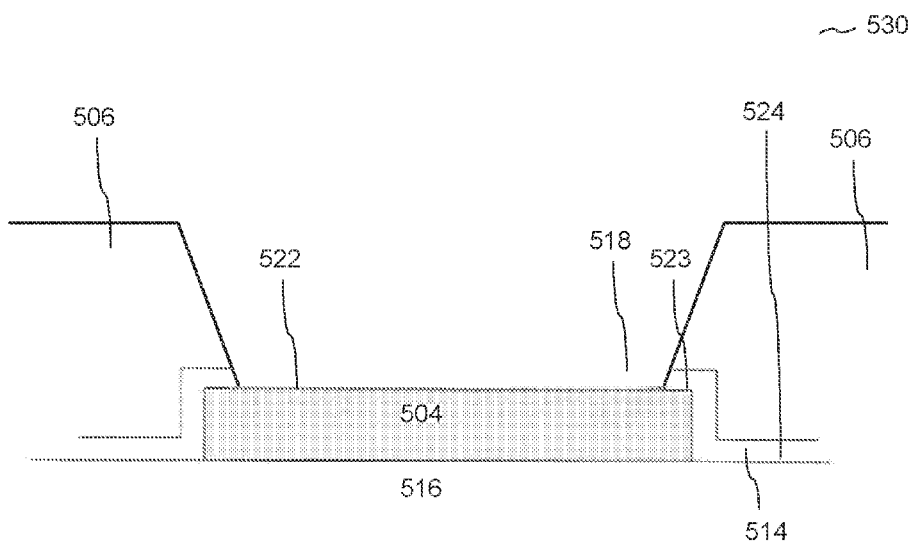
Figure 5D:
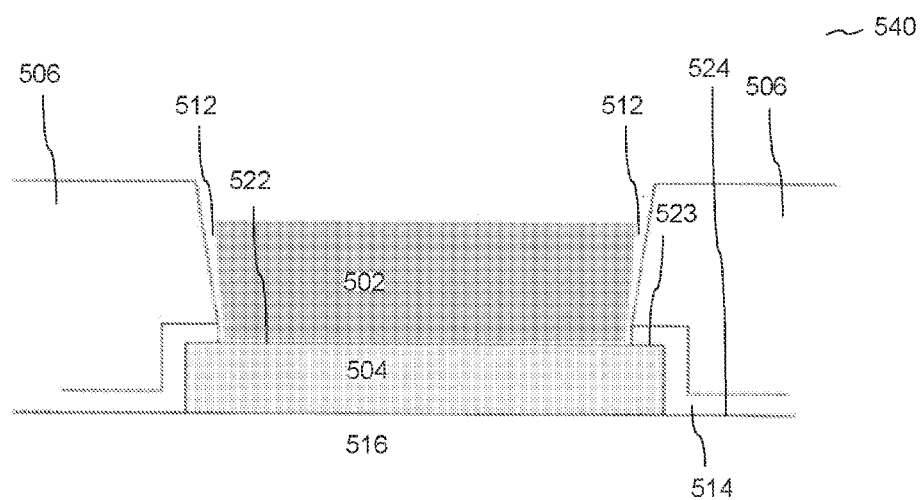
Figure 5E:
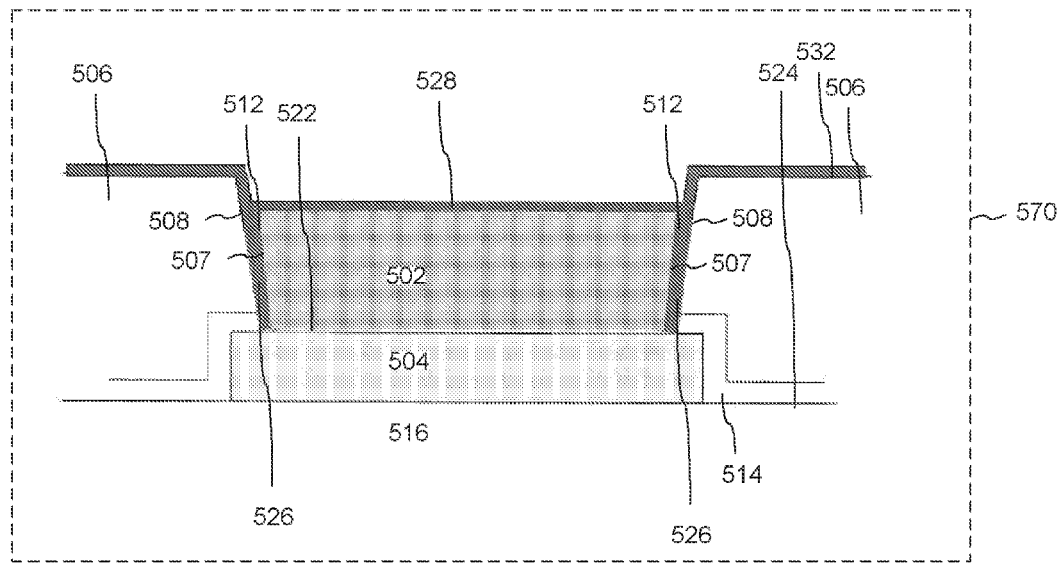
Figure 5F:
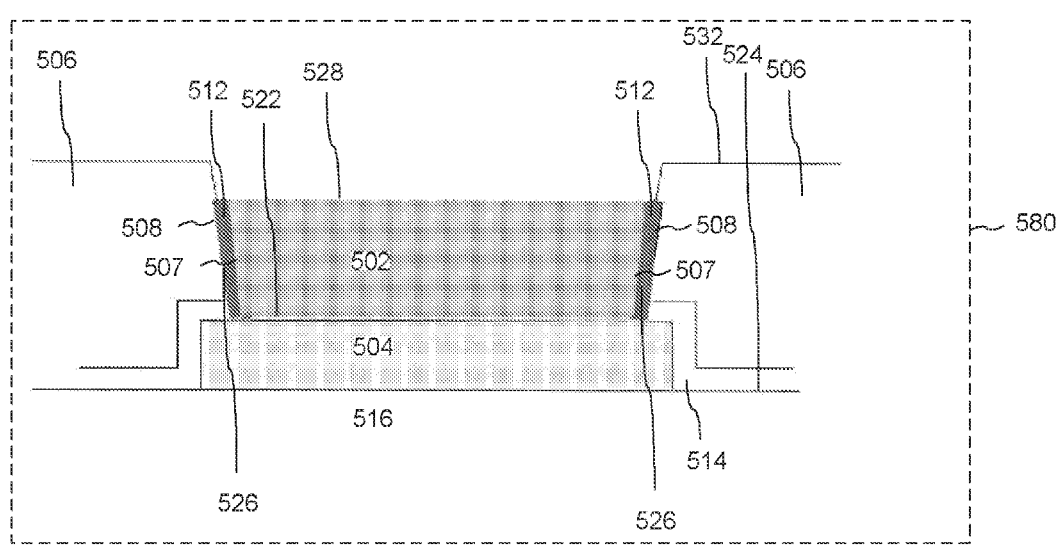
Figure 7:
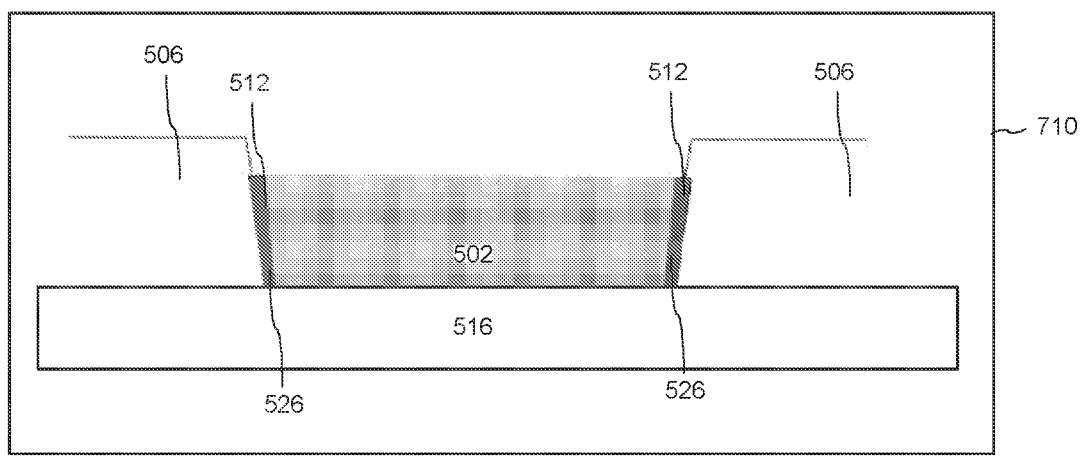
FIG. 7 shows a die arrangement according to an embodiment.

It may be understood that various embodiments may provide a die arrangement, e.g. as shown in FIG. 5E (570), FIG. 5F (580) and FIG. 7 (710). The die arrangement, e.g. 710, e.g. 570, e.g. 580, may include: die 516, e.g. a semiconductor chip, including metal pad 502 formed between encapsulation material 506 of die 516, wherein metal pad 502 and encapsulation material 506 may be separated from each other by gap 512; and additional material 526 formed in gap 512 to narrow at least a part of gap 512.

It may be understood that various embodiments may provide a chip arrangement, e.g. as shown in FIG. 5E (570) and FIG. 5F (580). The chip arrangement, e.g. 570, e.g. 580, may include an electrically conductive contact 504; encapsulation material 506 formed over chip 506; an opening formed in encapsulation material 506 which exposes at least part of electrically conductive contact 504; bond pad 502 formed over exposed part 522 of electrically conductive contact 504, wherein bond pad 502 and encapsulation material 506 may be separated from each other by gap 512; and additional material 526 in gap 512 to narrow at least a part of gap 512.

Various embodiments provide a method, which may include combining a gap free concept for non-ratio and ratio imide processes for closing a gap 512. Furthermore, additional lithography layers may not be needed, and therefore costs may be kept moderate.

Various embodiments provide a method for filling gap 512, wherein an isolating and adhesive cap layer, e.g. additional material 526 may be structured without any additional lithography layer, for filling gap 512. Furthermore well known package materials and/or interfaces for bonding and molding may remain relatively unchanged. Assuming good processability of additional material 526, which may include an adhesive layer, i.e. it may have adhesive properties for filling of gap 512, known materials, e.g. semiconductor fabrication compatible materials, e.g. polyimide, e.g. carbon based materials, e.g. organic solutions, may be used.

Various embodiments provide a method for protecting chip components from attack and/or corrosion. Redistribution layers, e.g. nickel based redistribution layers and/or electrically conductive contacts 504 may be extremely susceptible to corrosion.

It may be understood that methods 400, 500 and 600 may also be applicable in soldering applications, e.g. flip chip bonding, e.g. embedded wafer level packages, e.g. eWLB, wherein metal pad 502 may include, e.g solder bumps and/or solder alloy and/or solder balls. Methods 400 and 500 may also be application for fine pitch bonding technology wherein narrow gaps may be filled.

Various embodiments provide a method for manufacturing a metal pad structure of a die, the method including: forming a metal pad between encapsulation material of the die, wherein the metal pad and the encapsulation material are separated from each other by a gap; and forming additional material in the gap to narrow at least a part of the gap.

According to an embodiment, the method further includes depositing the encapsulation material over an electrically conductive portion of the die; forming an opening in the encapsulation material, which exposes at least a part of the electrically conductive portion; and forming the metal pad over the part of the electrically conductive portion exposed by the opening in the encapsulation material.

According to an embodiment, forming an opening in the encapsulation material, which exposes at least a part of the electrically conductive portion comprises selectively removing the encapsulation material from a part of the electrically conductive portion, such that a part of the electrically conductive portion is free from the encapsulation material.

According to an embodiment, forming an opening in the encapsulation material, which exposes at least a part of the electrically conductive portion comprises exposing a part of the electrically conductive portion by removing the encapsulation material from the part of the electrically conductive portion.

According to an embodiment, the method further includes depositing the encapsulation material over an electrically conductive contact of the die; forming an opening in the encapsulation material, which exposes at least a part of the electrically conductive contact; and forming the metal pad over the part of the electrically conductive contact exposed by the opening in the encapsulation material.

According to an embodiment, depositing the encapsulation material over an electrically conductive contact of the die includes depositing encapsulation material over an electrically conductive redistribution layer of the die.

According to an embodiment, forming an opening in the encapsulation material, which exposes at least a part of the electrically conductive portion comprises selectively removing the encapsulation material from a part of the electrically conductive contact, such that a part of the electrically conductive contact is free from the encapsulation material.

According to an embodiment, forming an opening in the encapsulation material, which exposes at least a part of the electrically conductive portion comprises exposing a part of the electrically conductive contact by removing the encapsulation material from the part of the electrically conductive contact.

According to an embodiment, the method further includes depositing the encapsulation material over a die including an electrically conductive contact; selectively removing a portion of the encapsulation material such that a part of the electrically conductive contact is exposed; and forming the metal pad over the part of the electrically conductive contact exposed by selectively removing the portion of the encapsulation material.

According to an embodiment, the method further includes depositing passivation material over a die including an electrically conductive contact; depositing the encapsulation material over the passivation material; selectively removing a portion of the passivation material and the encapsulation material such that a part of the electrically conductive contact is exposed; and forming the metal pad over the part of the electrically conductive contact exposed by selectively removing the passivation material and the encapsulation material.

According to an embodiment, forming a metal pad between encapsulation material of the die includes depositing a metal pad between encapsulation material of the die by at least one deposition method from the following group of deposition methods, the group consisting of: electroless plating, electroplating, galvanic deposition, sputtering, evaporation.

According to an embodiment, the metal pad and the encapsulation material are separated from each other by a gap ranging from about 10 nm to about 500 nm.

According to an embodiment, forming additional material in the gap to narrow at least a part of the gap includes forming an electrically conductive material in the gap.

According to an embodiment, the additional material includes at least one electrically conductive material from the group of electrically conductive materials, the group of electrically conductive materials consisting of: palladium, silver, platinum, gold.

According to an embodiment, forming additional material in the gap to narrow at least a part of the gap includes forming an electrically insulating material in the gap.

According to an embodiment, the additional material includes at least one electrically insulating material from the group of electrically insulating materials, the group of electrically insulating materials consisting of: epoxy, organic polymer, inorganic polymer, polyimide, a carbon-based material.

According to an embodiment, forming additional material in the gap includes forming additional material in the gap by at least one deposition method from the following group of deposition methods, the group consisting of: spraying, vapor phase deposition, spin coating, dip coating, chemical vapor deposition, plasma enhanced chemical vapor deposition, atomic layer deposition, electroless plating, electroplating.

According to an embodiment, forming additional material in the gap to narrow at least a part of the gap includes at least partially filling the gap with the additional material.

According to an embodiment, forming additional material in the gap to narrow at least a part of the gap includes adhering the additional material to one or more sidewalls of the encapsulation material.

According to an embodiment, the metal pad includes a thickness ranging from about 200 nm to about 20 μm.

According to an embodiment, the metal pad includes an over pad metallization layer.

Various embodiments provide a method for manufacturing a bond pad of a chip, the method including: forming encapsulation material over a chip including an electrically conductive contact; selectively removing a portion of the encapsulation material to expose at least part of the electrically conductive contact; forming a bond pad over the part of the electrically conductive contact exposed by selectively removing the portion of the encapsulation material, wherein the bond pad and the encapsulation material are separated from each other by a gap; and forming additional material in the gap to narrow at least a part of the gap.

Various embodiments provide a die arrangement including: a die including a metal pad formed between encapsulation material of the die, wherein the metal pad and the encapsulation material are separated from each other by a gap; and additional material formed in the gap to narrow at least a part of the gap.

Various embodiments provide a chip arrangement including: a chip including an electrically conductive contact; encapsulation material formed over the chip; an opening formed in the encapsulation material which exposes at least part of the electrically conductive contact; a bond pad formed over the exposed part of the electrically conductive contact, wherein the bond pad and the encapsulation material are separated from each other by a gap; and additional material in the gap to narrow at least a part of the gap.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a metal pad structure of a die, the method comprising:
    forming a metal pad between encapsulation material of the die, wherein the metal pad and the encapsulation material are separated from each other by a gap; and
    forming additional material in the gap to narrow at least a part of the gap, wherein forming the additional material in the gap comprises adhering the additional material to one or more sidewalls of the encapsulation material.

2. The method according to claim 1, further comprising
    depositing the encapsulation material over an electrically conductive portion of the die;
    forming an opening in the encapsulation material, which exposes at least a part of the electrically conductive portion; and
    forming the metal pad over the part of the electrically conductive portion exposed by the opening in the encapsulation material.

3. The method according to claim 1, further comprising
    depositing the encapsulation material over an electrically conductive contact of the die;
    forming an opening in the encapsulation material, which exposes at least a part of the electrically conductive contact; and
    forming the metal pad over the part of the electrically conductive contact exposed by the opening in the encapsulation material.

4. The method according to claim 3, wherein
    depositing the encapsulation material over an electrically conductive contact of the die comprises depositing encapsulation material over an electrically conductive redistribution layer of the die.

5. The method according to claim 1, further comprising
    depositing the encapsulation material over a die comprising an electrically conductive contact;
    selectively removing a portion of the encapsulation material to expose at least a part of the electrically conductive contact; and
    forming the metal pad over the part of the electrically conductive contact exposed by selectively removing the portion of the encapsulation material.

6. The method according to claim 1, further comprising
    depositing passivation material over a die comprising an electrically conductive contact;
    depositing the encapsulation material over the passivation material;
    selectively removing a portion of the passivation material and the encapsulation material to expose at least a part of the electrically conductive contact; and
    forming the metal pad over the part of the electrically conductive contact exposed by selectively removing the passivation material and the encapsulation material.

7. The method according to claim 1, wherein
    forming a metal pad between encapsulation material of the die comprises depositing a metal pad between encapsulation material of the die by at least one deposition method from the following group of deposition methods, the group consisting of: electroless plating, electroplating, galvanic deposition, sputtering, evaporation.

8. The method according to claim 1,
    wherein the metal pad and the encapsulation material are separated from each other by a gap ranging from about 10 nm to about 500 nm.

9. The method according to claim 1,
    wherein forming additional material in the gap to narrow at least a part of the gap comprises forming an electrically conductive material in the gap.

10. The method according to claim 1,
    wherein the additional material comprises at least one electrically conductive material from the group of electrically conductive materials, the group of electrically conductive materials consisting of: palladium, silver, platinum, gold.

11. The method according to claim 1,
    wherein forming additional material in the gap to narrow at least a part of the gap comprises forming an electrically insulating material in the gap.

12. The method according to claim 1,
    wherein the additional material comprises at least one electrically insulating material from the group of electrically insulating materials, the group of electrically insulating materials consisting of: epoxy, organic polymer, inorganic polymer, polyimide, a carbon-based material.

13. The method according to claim 1,
    wherein forming additional material in the gap comprises forming additional material in the gap by at least one deposition method from the following group of deposition methods, the group consisting of: spraying, vapor phase deposition, spin coating, dip coating, chemical vapor deposition, plasma enhanced chemical vapor deposition, atomic layer deposition, electroless plating, electroplating.

14. The method according to claim 1,
    wherein forming additional material in the gap to narrow at least a part of the gap comprises at least partially filling the gap with the additional material.

15. The method according to claim 1,
    wherein the metal pad comprises a thickness ranging from about 200 nm to about 20 μm.

16. The method according to claim 1,
    wherein the metal pad comprises an over pad metallization layer.

17. The method according to claim 2, wherein
    forming an opening in the encapsulation material, which exposes at least a part of the electrically conductive portion comprises selectively removing the encapsulation material from a part of the electrically conductive portion, such that a part of the electrically conductive portion is free from the encapsulation material.

18. The method according to claim 2, wherein
forming an opening in the encapsulation material, which exposes at least a part of the electrically conductive portion comprises exposing a part of the electrically conductive portion by removing the encapsulation material from the part of the electrically conductive portion.

19. The method according to claim 3, wherein
forming an opening in the encapsulation material, which exposes at least a part of the electrically conductive portion comprises selectively removing the encapsulation material from a part of the electrically conductive contact, such that a part of the electrically conductive contact is free from the encapsulation material.

20. The method according to claim 3, wherein
forming an opening in the encapsulation material, which exposes at least a part of the electrically conductive portion comprises exposing a part of the electrically conductive contact by removing the encapsulation material from the part of the electrically conductive contact.

21. A method for manufacturing a bond pad of a chip, the method comprising:
forming encapsulation material over a chip comprising an electrically conductive contact;
selectively removing a portion of the encapsulation material to expose at least part of the electrically conductive contact;
forming a bond pad over the part of the electrically conductive contact exposed by selectively removing the portion of the encapsulation material, wherein the bond pad and the encapsulation material are separated from each other by a gap; and
forming additional material in the gap to narrow at least a part of the gap, wherein forming the additional material in the gap comprises adhering the additional material to one or more sidewalk of the encapsulation material.

22. A die arrangement comprising:
a die comprising a metal pad formed between encapsulation material of the die, wherein the metal pad and the encapsulation material are separated from each other by a gap; and
additional material formed in the gap to narrow at least a part of the gap, wherein the additional material adheres to one or more sidewalk of the encapsulation material.

23. A chip arrangement comprising:
a chip comprising an electrically conductive contact;
encapsulation material formed over the chip;
an opening formed in the encapsulation material which exposes at least part of the electrically conductive contact;
a bond pad formed over the exposed part of the electrically conductive contact, wherein the bond pad and the encapsulation material are separated from each other by a gap; and
additional material in the gap to narrow at least a part of the gap, wherein the additional material adheres to one or more sidewalls of the encapsulation material.

* * * * *